United States Patent [19]
Seliger et al.

[11] 4,112,455
[45] Sep. 5, 1978

[54] FIELD-EFFECT TRANSISTOR WITH EXTENDED LINEAR LOGARITHMIC TRANSCONDUCTANCE

[75] Inventors: Robert L. Seliger, Agoura; James W. Ward, Canoga Park, both of Calif.

[73] Assignee: The United States of America as represented by the Secretary of the Navy, Washington, D.C.

[21] Appl. No.: 763,265

[22] Filed: Jan. 27, 1977

[51] Int. Cl.² .................................................. H01L 29/78
[52] U.S. Cl. .................................... 357/23; 357/22; 357/90; 357/91
[58] Field of Search .................. 357/22, 23, 90, 91

[56] References Cited

U.S. PATENT DOCUMENTS

| 3,449,647 | 6/1969 | Scott et al. | 357/22 |
| 3,745,426 | 7/1973 | Olmstead | 357/23 |

Primary Examiner—Edward J. Wojciechowicz
Attorney, Agent, or Firm—R. S. Sciascia; L. I. Shrago

[57] ABSTRACT

The linearity of a field-effect transistor's logarithmic transconductance is extended over an increased range by having its channel non-uniformly doped in a direction along the width of the gate electrode and perpendicular to that of current flow.

2 Claims, 2 Drawing Figures

FIELD-EFFECT TRANSISTOR WITH EXTENDED LINEAR LOGARITHMIC TRANSCONDUCTANCE

The present invention relates generally to semi-conductor devices and their method of manufacture and, more particularly, to a field-effect transistor having a logarithmic transconductance which is linear over four orders of magnitude.

The transconductance, $g_m$, of a field-effect transistor represents the change in drain current, $I_D$, at a given drain voltage, $V_D$, caused by a change in gate voltage, $V_G$. In a typical RF amplifier configuration, the FET usually has its gate biased by a DC voltage and its drain also DC biased beyond saturation. The application of an AC input signal to the gate bias causes the drain current to swing about a quiescent value. The ratio of this swing to a given small gate voltage swing is equal to the transconductance. Thus, the transconductance is often referred to as the gain, actually the small signal gain of the FET. Since the gate junction is back biased with respect to the source and drain, the input impedance of the FET is very high, being on the order of $10^{12}$ ohms. Because of this and other characteristics, the FET is an excellent circuit element for amplifying very small signal voltages, such as those normally present at the antenna of a radar receiver when the system is detecting a distant or obscured target.

In the conventional FET where the channel between the source and drain is uniformly doped, the transconductance can be controlled by the gate bias over a useful range of about one decade. This performance is independent of the actual doping level of the channel and is a fundamental property of all standard field-effect transistors.

When employed in a radar receiver, the FET normally is biased for maximum $g_m$ with a weak received signal, such as one originating from a remote or partially obscured target. However, if the radar mode of operation involves searching for targets that are obscured intermittently by obstructions or clouds, for example, the detected signal level may vary over several orders of magnitudes. For the FET to operate efficiently under these conditions, it should, therefore, have a transconductance which can be varied over many orders of magnitude. Such a characteristic would permit the FET to function in an automatic gain control circuit to accommodate the large variations in the received signal level encountered as a result of changing target distances and propagation conditions.

It is, accordingly, an object of the present invention to provide a field-effect transistor whose transconductance can be varied over several orders of magnitude easily by varying the gate voltage.

Another object of the present invention is to provide a field effect transistor having a channel whose doping concentration is controlled so as to extend the range of linearity of the transistor's logarithmic transconductance.

Another object of the present invention is to provide a method of fabricating FET devices which permits their electrical characteristics to be qualitatively changed so as to shift the constant-gate-voltage curves to lower values of drain current.

Another object of the present invention is to provide a technique for linearizing the logarithmic transconductance of an FET device and eliminate the knee of its log $G_m$ versus $V_G^*$ curve.

Other objects, advantages and novel features of the invention will become apparent from the following detailed description of the invention when considered in conjunction with the accompanying drawings wherein.

Briefly, and in general terms, the electrical characteristics of a field-effect transistor are selectively modified in a qualitative manner according to the present invention by tailoring the channel doping of the device in the direction of the gate width. The doping distribution is both non-uniform and non-linear. By utilizing a non-uniform doping profile, portions of the channel saturate and turn-off at different voltages since the occurrence of these conditions depend upon the doping level. Consequently, the FET structure of the present invention does not have a single saturation voltage or turn-off voltage. This has the effect, so to speak, of turning the FET into a device whose I-V characteristic corresponds to the curve obtained by summing the I-V characteristics of a plurality of somewhat dissimilar FET elements. By an appropriate selection of the doping profile, one can, therefore, achieve an I-V characteristic that is the combined results of two or more FETs operating in parallel with each having a particular doping level and channel dimension.

According to a preferred embodiment of the invention, the doping profile is such that it includes a short heavily doped region along the gate width and a complementary long lightly doped region. This combination of contrasting doping concentrations and lengths results in a linearized log $G_m$ curve that extends over four orders of magnitude as contrasted with the one order of magnitude available in prior art FET devices.

Figure 1:
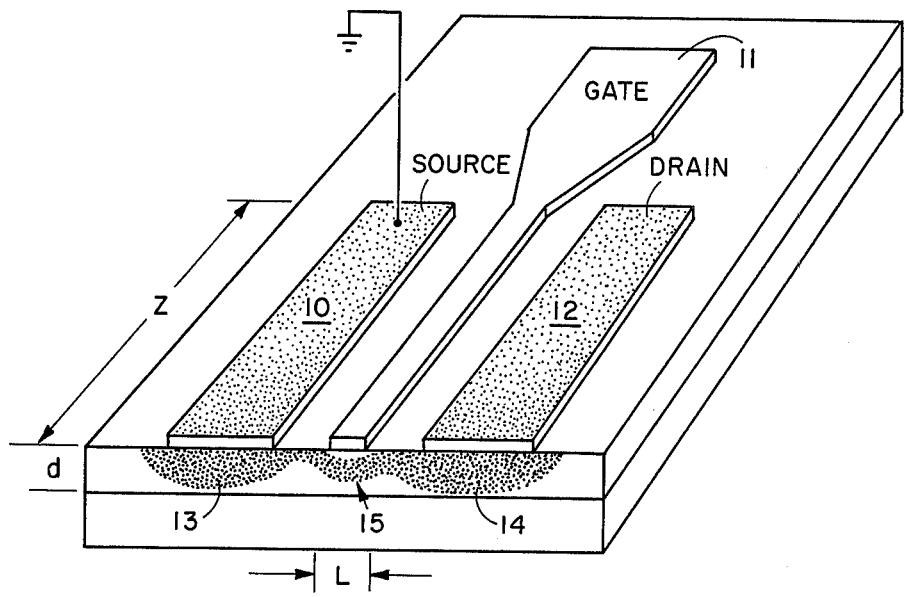
FIG. 1 is a schematic diagram of a field-effect transistor showing the location and dimensions of the channel.

Referring now to FIG. 1 of the drawings which schematically illustrates a simplified FET structure, it will be seen that the device includes a source terminal 10, a gate terminal 11 and a drain terminal 12, all arranged in their usual relative positions. Source and drain terminals 10 and 12 each make ohmic contact with either a "p" type or "n" type bed or pocket such as 13 and 14 formed in the substrate according to a particular design configuration. The gate terminal 11, which here extends the full length of the source and drain terminals and terminates in an extension of expanded size, makes ohmic contact with either a gate dielectric, not shown, or an "n" type or "p" type pocket or region of the substrate, again depending upon the process used to fabricate the FET, and whether it is to perform as an MOSFET, JFET or an IGFET device.

Region 15 between beds 13 and 14 constitutes a channel within which current flow occurs between the source and drain terminals under the control of the gate voltage. This channel, it should be appreciated, will have a conductivity different from that of the beds associated with the source and drain terminals. Thus, it may be either of the "n" type or "p" type. In any case, the existence of such a channel is a feature of all FET devices. In the showing of FIG. 1, the length of the channel is "L", its thickness is "d" and its width, "Z". The significant dimension in the present invention is "Z", the channel width along which the doping profile occurs. This dimension, although identified with the long dimension of the source and drain electrodes for convenience sake, actually is determined by the length of the beds 13 and 14 measured along the width of the gate where current flow can take place between the source and drain terminals.

The channel size of an FET device varies with gate voltage, and for an understanding of this behavior, reference may be had to the publication, "Physics and Technology of Semiconductor Devices" by A. S. Grove, published in 1967 by John Wiley and Sons, New York, and more particularly, to FIG. 8.2 on page 244 thereof.

Figure 2:
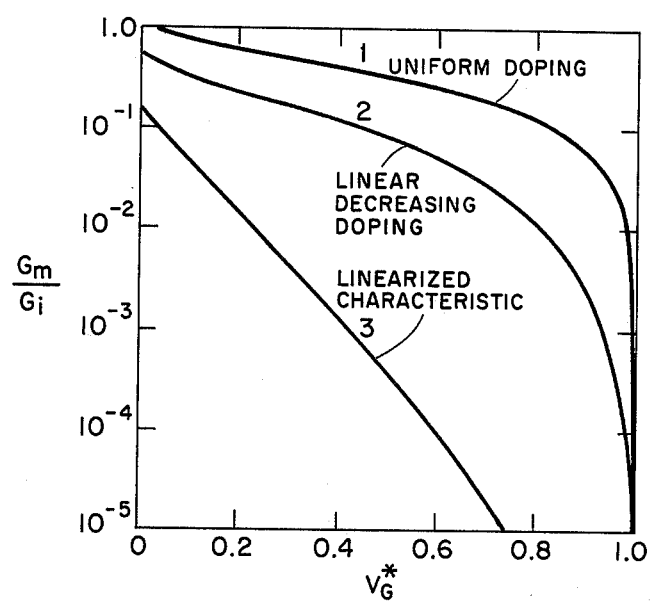
FIG. 2 is a plot of log $G_m$ versus $V_G^*$ for different channel doping profiles.

The gain characteristic of an FET with uniform channel doping is shown as curve 1 in FIG. 2 which is a plot of log $(G_m/G_i)$ versus $V_G^* \cdot (G_m/G_i)$ and $V_G^*$ are normalized quantities so that the qualitative shapes of different sets of characteristics can be readily compared. $G_i$ represents the transconductance of a channel with uniform doping $N_o$. $G_m$ is the total saturated transconductance of an FET device with a tailored doping profile, and reference may be had to the Grove publication mentioned hereinbefore for the integral which defines this parameter. The uniform channel doping condition corresponding to curve 1 is represented by case 1 in FIG. 3 which a plot of channel doping concentration $N(z)$ versus position $z$ along a channel of total width Z. As seen in curve 1 of FIG. 2, the gain characteristic has a sharp knee from which the logarithmic transconductance falls off very rapidly as turn-off is approached. The linearity of the log $G_m$ curve extends over a one decade range.

Figure 3:
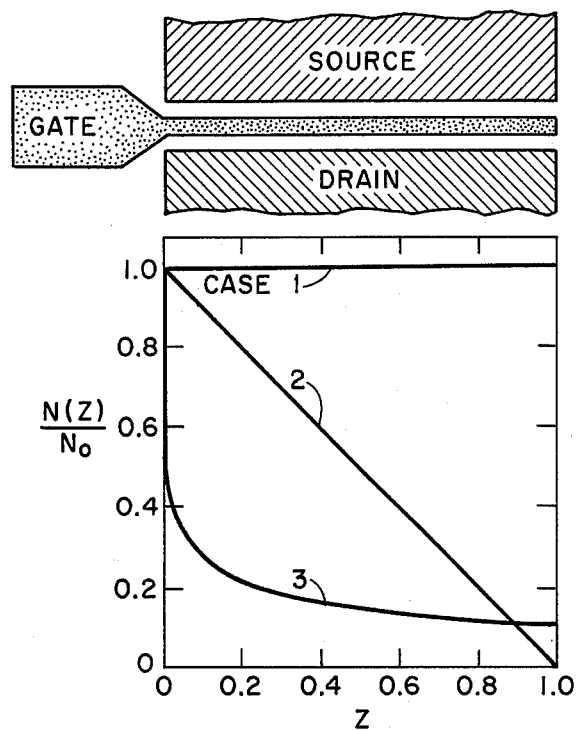
FIG. 3 illustrates the doping profiles which produce the gain curves of FIG. 2.

If a linearly decreasing channel doping profile is employed, such as that depicted in case 2 in FIG. 3, a gain characteristic similar to that of curve 2 in FIG. 2 is obtained. In this case, maximum doping $N_o$ occurs at $z = 0$ and the minimum at $z = 1.0$. This gain characteristic, case 2, has the same general shape as the constant doping curve, case 1, but the knee of the curve is less pronounced. Also, the maximum transconductance is reduced. This reduction is, of course, to be expected since the average doping level has been decreased by 50 percent from the uniform case.

If a non-linear lateral doping profile corresponding to that shown in case 3 in FIG. 3 is employed, then a linearized logarithmic gain characteristic, curve 3 in FIG. 2, is obtained. This curve has no knee and is substantially linear over four orders of magnitude. The maximum transconductance is less than that obtainable with the linearly decreasing case. As mentioned hereinbefore, profile No. 3 has a comparatively short section along the width of the gate where the doping concentration is high and a 90 percent plus segment where this level is comparatively low. Maximum doping is at $Z = 0$, but the minimum does not decrease to the level reached in the linearly decreasing case.

The doping profile $N(z)$ can be constant for the part of the channel with Z but increases rapidly only over a small region thereof. But, no matter what its particular shape, it should be co-extensive with the channel length, L. The functional form for case 3 identified above which linearizes the log $G_m$ vs. $V_G^*$ curve is $N(z)/N_o = \exp(-2.3z^{1/4})$. It would be pointed out that the value of $N_o$ must be chosen for each specific field-effect device. In the case of one GaAs device embodying the present invention, $N_o = 1.0 \times 10^{17}/cm^3$.

One method of fabricating the FET with the appropriate lateral doping distribution is to employ a computer controlled focused ion beam. In the case of one practical embodiment of the present invention where the FET device was a completely fabricated GaAs unit having an aluminum gate and an n channel, the implanting was accomplished with a focused 40 kv proton compensating beam that was directed through the gate. The desired exposure gradient was created by controlling the number of horizontal beam sweeps per line performed over a vertical field corresponding to the width of the gate.

What is claimed is:

1. A field-effect transistor of the type having a source region, a drain region and a channel region within which current flow takes place between said source and drain regions said channel region having a length dimension which is uniform and corresponds to the distance over which said current travels as it flows between said source and drain regions of said transistor and having a width dimension which is perpendicular to said length dimension and to the direction along which said current travels as it flows between said source and drain regions, said channel region having a non-linear dopant profile along its width dimension which is such that said field-effect transistor exhibits a logarithmic transconductance which is linear with gate signal voltage over an extended range.

2. A method of modifying the performance of an insulated gate field-effect transistor so as to impart to it a logarithmic transconductance versus gate voltage characteristic that is linear over an extended range which comprises the step of non-linearly doping by an ion implanting process the channel region of said transistor in a direction which is perpendicular to that along which current flow takes place between the source and drain regions of said transistor, said non-linear doping establishing different current flow and saturation conditions between the source and drain regions along the width of the gate electrode of said transistor.

* * * * *